United States Patent [19]
Pramanick et al.

[11] Patent Number: 5,854,132
[45] Date of Patent: Dec. 29, 1998

[54] METHOD FOR EXPOSING PHOTORESIST

[75] Inventors: Shekhar Pramanick, Fremont; Scott Luning, Menlo Park; Jonathon Fewkes, San Jose, all of Calif.

[73] Assignee: Advanced Micro Devices, Inc., Sunnyvale, Calif.

[21] Appl. No.: 346,041

[22] Filed: Nov. 29, 1994

[51] Int. Cl.$^6$ .................................................. H01L 21/465
[52] U.S. Cl. ...................... 438/669; 438/654; 438/657; 438/636; 438/720
[58] Field of Search .................................. 437/186, 225; 430/271, 272, 273, 950, 318, 319; 438/636, 654, 648, 669, 657, 671, 656, 720

[56] References Cited

U.S. PATENT DOCUMENTS

| | | |
|---|---|---|
| 4,529,685 | 7/1985 | Borodovsky . |
| 4,707,721 | 11/1987 | Ang et al. . |
| 4,804,636 | 2/1989 | Groover, III et al. . |
| 4,820,611 | 4/1989 | Arnold, III et al. ................... 430/271 |
| 4,897,368 | 1/1990 | Kobushi et al. ........................ 437/200 |
| 5,001,108 | 3/1991 | Taguchi . |
| 5,034,348 | 7/1991 | Hartswick et al. . |
| 5,065,220 | 11/1991 | Paterson et al. . |
| 5,091,763 | 2/1992 | Sanchez . |
| 5,219,788 | 6/1993 | Abernathey et al. ................... 437/187 |
| 5,302,538 | 4/1994 | Ishikawa et al. ......................... 437/40 |
| 5,312,780 | 5/1994 | Nanda et al. ............................ 437/225 |
| 5,335,204 | 8/1994 | Matsuo et al. . |
| 5,441,914 | 8/1995 | Taft et al. ............................... 437/189 |
| 5,580,701 | 12/1996 | Lur et al. ................................. 430/316 |
| 5,626,967 | 5/1997 | Pramanick et al. ..................... 428/446 |

FOREIGN PATENT DOCUMENTS

| | | |
|---|---|---|
| 3435750 | 4/1986 | Germany . |
| 07260 | 3/1994 | Germany . |
| 4158577 | 3/1992 | Japan . |
| 6-196494 | 7/1994 | Japan . |

OTHER PUBLICATIONS

Rocke, et al., "Titanium Nitride for Antireflection Control and Hillock Suppression on Aluminum Silicon Metallization", Journal of Vacuum Science & Technology, Part B, vol. 6, No. 4, Jul./Aug. (1988), New York, US.

S. Wolf et al "Silicon Processing for the VLSI Era, vol.I" Lattice Press (Calif.) (1986) p. 323.

H. J. Dijkstra, et al. "Optimization of Anti–Reflection Layers for Deep–UV Lithography" Proc. of the SPIE (Mar. 1993), vol. 1927 pt.1, pp. 275–286 vol. I, (abstract Only).

*Primary Examiner*—Caridad Everhart
*Attorney, Agent, or Firm*—Skjerven, Morrill, MacPherson, Franklin & Friel LLP; Edward C. Kwok

[57] ABSTRACT

A method for patterning a polysilicon layer includes creating a TiN layer above an amorphous silicon (a-Si) layer forming a TiN/a-Si stack. The TiN/a-Si stack is formed above the polysilicon layer. The TiN layer serves as an ARC to reduce overexposure of the photoresist used to pattern the polysilicon layer, while the a-Si layer prevents contamination of the layer below the polysilicon layer.

4 Claims, 5 Drawing Sheets

METHOD FOR EXPOSING PHOTORESIST

FIELD OF THE INVENTION

This invention relates to structures and methods for manufacturing integrated circuits, and particularly, methods for exposing photoresist used in manufacturing integrated circuits.

BACKGROUND

Manufacturers of integrated circuits often need to pattern polysilicon structures over a non-planar topography. For example, field oxide structures 110 and 120 in FIG. 1 cause an integrated circuit structure 100 to have a non-planar topography. During photolithographic processing of a polysilicon layer 130, light reflected from portions of polysilicon layer 130, near field oxide edges 111 and 121, cause a photoresist layer 140 to receive a non-uniform distribution of light energy. Consequently, the portions of photoresist layer 140 near field oxide edges 111 and 121 are overexposed, resulting in "notching" of polysilicon layer 130 near field oxide edges 111 and 121 in the final product. FIG. 2 shows a plan view of the polysilicon structure with notches 201–204 occurring in polysilicon layer 130 near edges of field oxide structures 110 and 120. Notching introduces inaccuracy in the desired polysilicon structure, which may degrade performance and reliability. The problems introduced by notching become more pronounced as the polysilicon structures get smaller with improvements in process technology. For example, notching is an acute problem for leading edge 0.35 micron (and beyond) process technology.

One solution to this problem is to cover the polysilicon layer with an anti-reflective coating (ARC) to reduce overexposure of the photoresist material. Amorphous silicon (a-Si), $SiO_xN$, and TiN can be used to form an ARC. TiN is commonly used as an ARC because TiN has very good anti-reflective properties, and TiN deposition is well known. However, as shown in FIG. 3, during subsequent processing, Ti particles 310 from the TiN layer may diffuse through polysilicon layer 130 and contaminate layer 320 below polysilicon layer 130. The Ti particles 310 are able to diffuse through polysilicon layer 130 along the grain boundaries 330 in the polysilicon. The Ti contamination of layer 320 can cause serious problems in some integrated circuits. For example, if polysilicon layer 130 is used for forming a gate in a MOSFET, during subsequent processing, Ti particles 310 can diffuse through the polysilicon layer 130 to contaminate the gate oxide layer formed of $SiO_2$, represented by layer 320. Under typical processing conditions, Ti will react with $SiO_2$ in the gate oxide layer to form $TiO_2$, thereby degrading the gate oxide layer's integrity and reliability. This would pose serious yield and reliability problems for leading edge MOSFET process technologies where gate oxides are getting progressively thinner.

SUMMARY

In accordance with one embodiment of the present invention, a structure for patterning a polysilicon layer includes a TiN layer located above an a-Si layer forming a TiN/a-Si stack. The TiN/a-Si stack is located above the polysilicon layer. The a-Si layer is formed by deposition, or by species implantation of the upper portion of the polysilicon layer with species such as Si or Ge. The TiN layer is formed above the a-Si layer by deposition. The TiN layer serves as an ARC to reduce overexposure of the photoresist used to pattern the polysilicon layer, while the a-Si layer prevents contamination of the layer below the polysilicon layer. As a result, the TiN/a-Si stack reduces notching of the polysilicon layer without degrading the integrity or reliability of the layer below the polysilicon.

DETAILED DESCRIPTION

Figure 1:
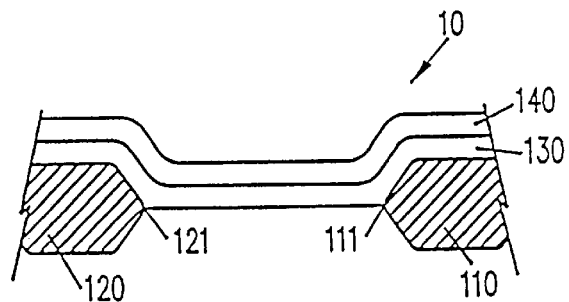
FIG. 1 shows a cross sectional view of the topography of an integrated circuit structure.
Figure 2:
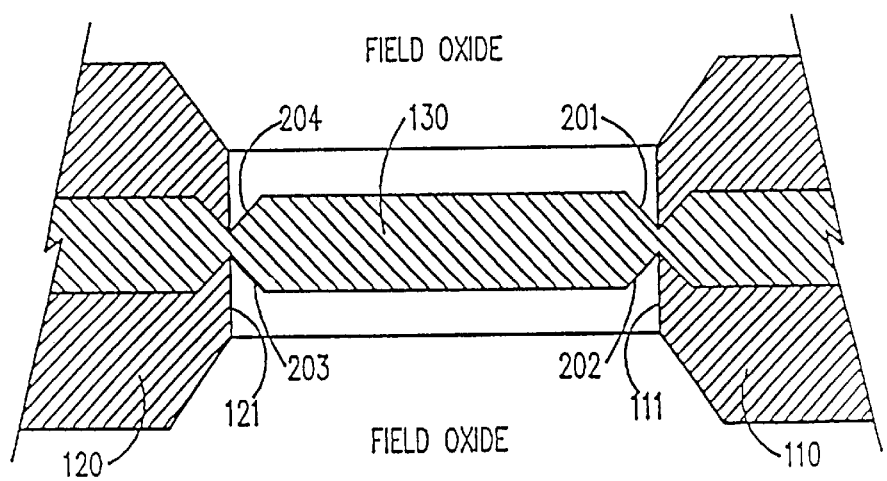
FIG. 2 shows a plan view of the notching effect.
Figure 3:
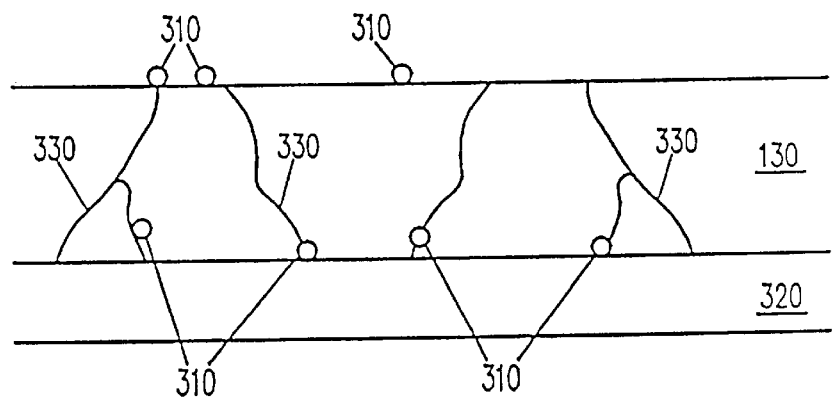
FIG. 3 shows a cross-sectional view of Ti diffusion through a polysilicon layer.
Figure 4:
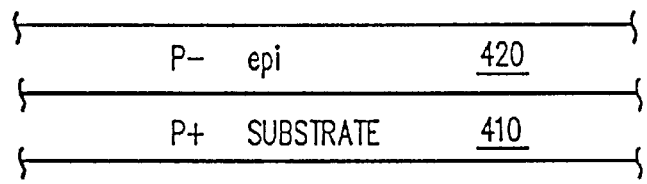
FIGS. 4–12 show a process forming a structure according to an embodiment of the present invention.

FIGS. 4–12 show a process flow for manufacturing a MOSFET using a stack according to one embodiment of the present invention. The term MOSFET as used herein also refers to silicon gate FETs. Like reference numbers are used between drawings for like structures. FIG. 4 shows the formation of a P type epitaxial layer 420 above P+ Substrate 410. P type epitaxial layer 420 has a resistivity of approximately 10 Ω-cm and is formed using conventional deposition methods. Although an epitaxial Si layer is described, conventional (e.g., non-epitaxial Si) can be used instead of epitaxial Si for MOSFET fabrication.

Figure 5:
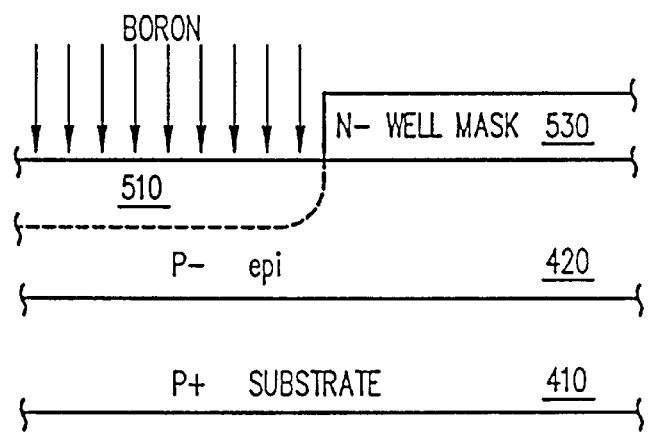

FIG. 5 shows the formation of a P-well 510 in epitaxial layer 420. Conventional photolithographic methods are used to form resist mask 530 and thereby define the surface of P-well 510 in epitaxial layer 420. P-well 510 is formed by implanting boron in the unmasked portion of epitaxial layer 420 using an implantation dose of 1E13 $cm^{-2}$ and 80 KV.

Figure 6:
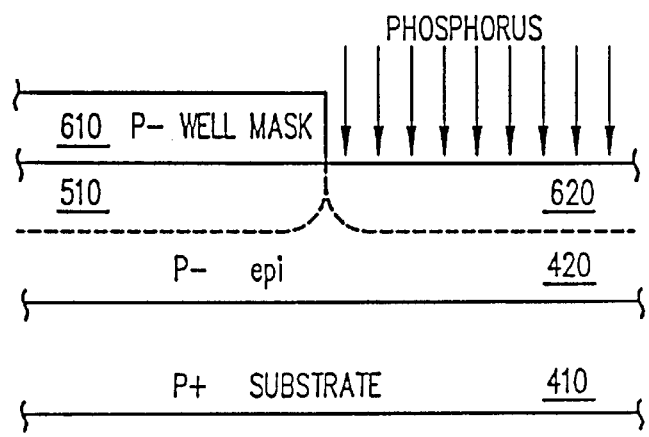

FIG. 6 shows the formation of an N-well in epitaxial layer 420. Resist mask 530 (FIG. 5) is removed, and resist mask 610 is formed above P-well 510 using conventional photolithographic methods. N-well 620 is formed by implanting phosphorus in the now unmasked portion of epitaxial layer 420 using an implantation dose of 3E13 $cm^{-2}$ and 100 KV.

Figure 7:
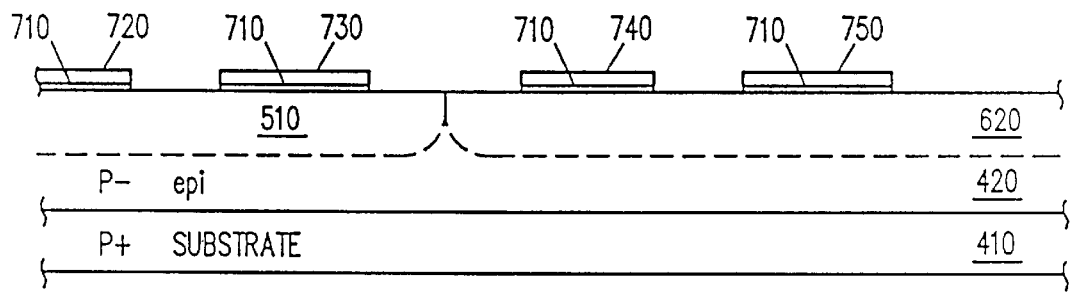

FIG. 7 shows the definition of the source and drain areas by using a nitride mask. Resist mask 610 (FIG. 6) is removed and a barrier oxide 710 and a nitride layer having a thickness of 2000 Å is deposited over P-well 510 and N-well 620. The nitride layer and barrier oxide 710 are etched to form nitride masks 720–750 which define the source and drain areas.

Figure 8:
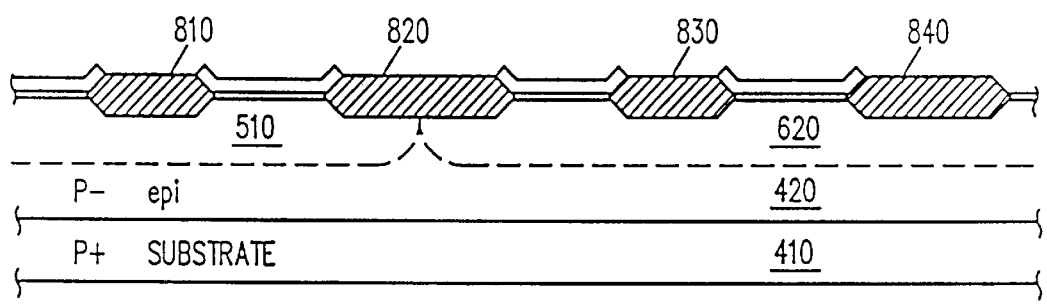

FIG. 8 shows the formation of field oxide structures. Field oxide structures 810–840 are formed by exposing the areas of epitaxial layer 420 not masked by nitride masks 720–750 to a gas of 4% $O_2$ and 96% Ar at 1100° C. and 1 atm pressure for 70 hours.

Figure 9:
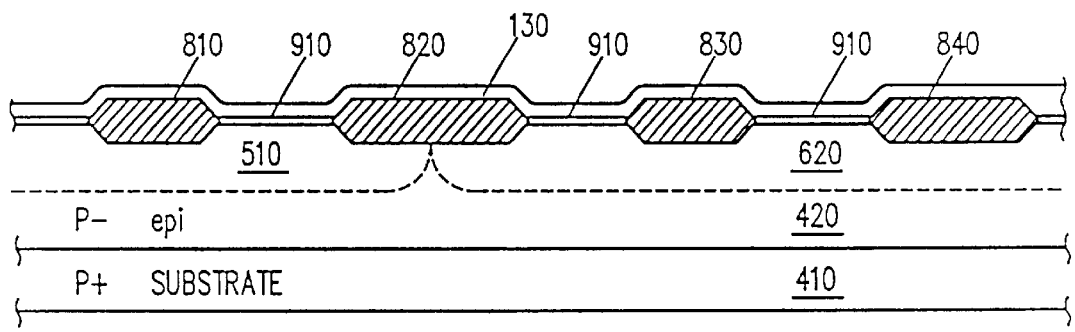

FIG. 9 shows the formation of a polysilicon layer over epitaxial layer 420 and field oxide structures 810–840. Nitride masks 720–750 and barrier layer 710 (FIG. 8) are removed and a gate oxide layer 910 is formed between field oxide structures 810–840. Polysilicon layer 130 is deposited over field oxide structures 810–840 and gate oxide layer 910 to a thickness of approximately 2000 Å, with a grain size of approximately 500–1000Å.

Figure 10:
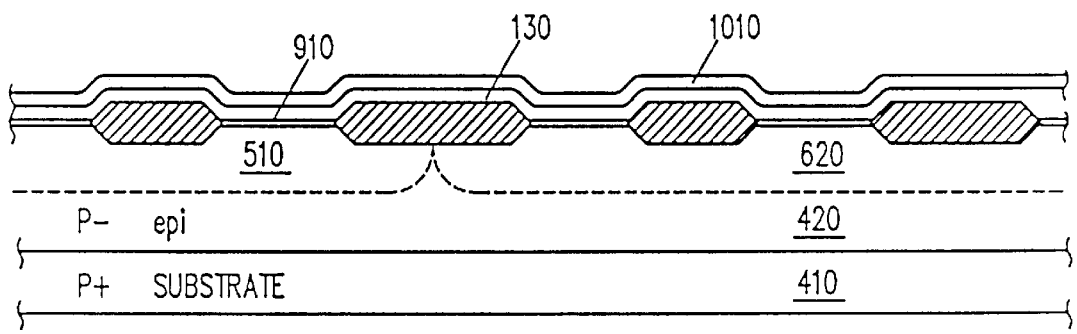

FIG. 10 shows the formation of an a-Si layer over polysilicon layer 130. An a-Si layer 1010 is formed to a thickness of approximately 200–500 Å by deposition.

Figure 11:
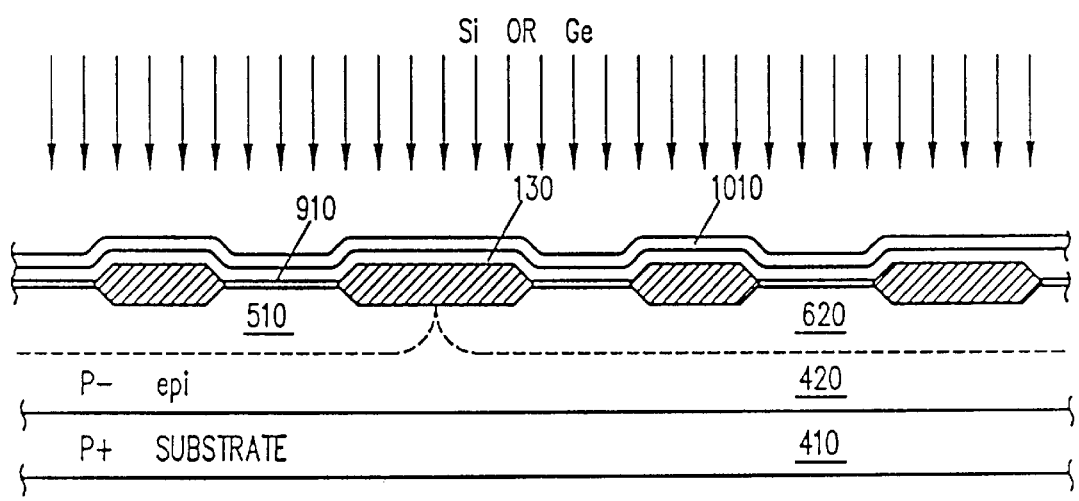

Alternatively, FIG. 11 shows the formation of a-Si layer 1010 having a thickness of approximately 100–400 Å by species implantation of the upper portion of polysilicon layer 130. For example, a dose of Ge at 3E14 cm$^{-2}$ and 30 KV, or, alternatively, a dose of Si at 1E15 cm$^{-2}$ and 30 KV can be used to form a-Si layer 1010. Of course, other species and doses may be used to form a-Si layer 1010.

Figure 12:
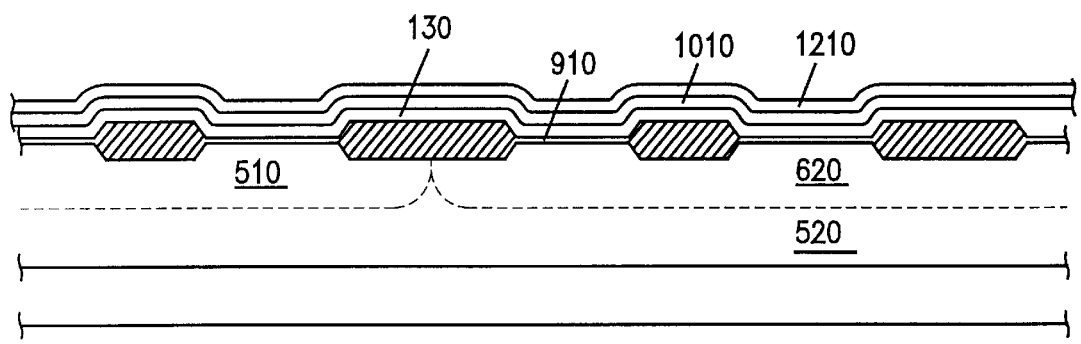

FIG. 12 shows formation of a TiN layer over a-Si layer 1010. TiN layer 1210 is deposited to a thickness of 800 Å. Alternatively, TiN layer 1210 may be deposited directly on polysilicon layer 130. The upper portion of polysilicon layer 130 is subsequently species implanted with Ge or Si to form a-Si layer 1010. In this case, a larger voltage than described above in conjunction with FIG. 11 is needed for the species particles to travel through TiN layer 1210 and form a-Si layer 1010. Conventional methods are then used to pattern polysilicon layer 130 to form the desired MOSFETs.

Figure 13:
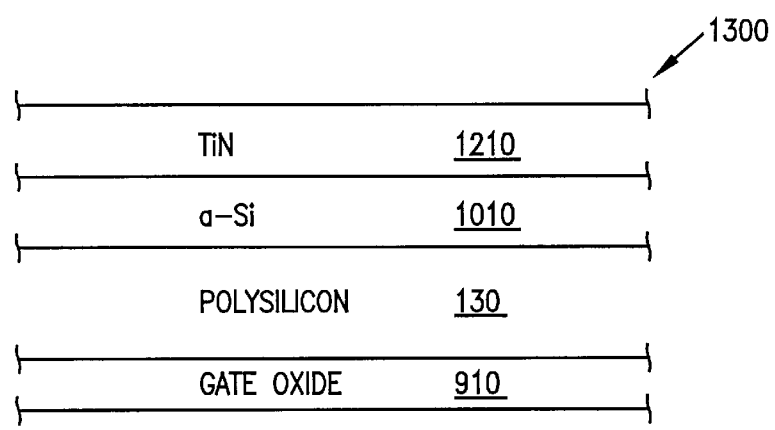
FIG. 13 shows a cross-sectional view of a structure according to an embodiment of the present invention.

FIG. 13 shows a stack 1300 resulting from the process described above in conjunction with FIGS. 4–12. Stack 1300 comprises an a-Si layer 1010 formed above polysilicon layer 130, and a TiN layer 1210 formed above a-Si layer 1010. Stack 1300 is used in patterning polysilicon layer 130.

The TiN layer 1210 is used as an ARC. The anti-reflective properties of TiN layer 1210 reduce overexposure of the photoresist layer (not shown) used in patterning polysilicon layer 130, thereby reducing the notching effect. However, as described above, if Ti from TiN layer 1210 contacts polysilicon layer 130, then the Ti can diffuse through polysilicon layer 130 to contaminate gate oxide layer 910.

Although TiN is used in this embodiment as the ARC, any material having suitable anti-reflective properties can be used. Embodiments of this invention are advantageously used when particles from the ARC can diffuse through polysilicon layer 130 to degrade layer 910.

The a-Si layer 1010 is used to bar Ti from contacting polysilicon layer 130. During subsequent processing steps, the photoresist and the TiN layer is removed. However, some Ti is typically left behind after the TiN layer is removed. In this embodiment, the Ti is left on a-Si layer 1010. Ti has a diffusion rate through a-Si on the order of $10^5$ slower than through polysilicon. Consequently, an a-Si layer having a thickness of 200 Å is sufficient to prevent Ti from contacting polysilicon layer 130 under typical processing conditions. Further, a-Si is a "getter" relative to polysilicon because the heat of formation of TiSi$_2$ from a-Si is greater than from polysilicon. As a result, when in subsequent processing a-Si layer 1010 is removed, the leftover Ti is removed along with a-Si layer 1010. Thus, stack 1300 reduces the notching effect without contaminating gate oxide layer 910 with Ti.

Although a-Si is used in this embodiment to prevent diffusion of particles leftover from the ARC, any material may be used provided that particles from the material itself does not degrade the performance and reliability of gate oxide layer 910, and that the material has a suitably slow diffusion rate for the leftover particles from the ARC.

The foregoing has described the principles and preferred embodiments of the present invention. However, the invention should not be construed as being limited to the particular embodiments described. For example, different species may be used to form the a-Si layer from the upper portion of the polysilicon layer and different methods may be used to form the field oxide structures. Further, the final product need not be a MOSFET. Rather, any integrated circuit device having a polysilicon layer requiring reduced notching and a Ti-sensitive layer below the polysilicon layer can advantageously use embodiments of the present invention. Thus, the above-described embodiments should be regarded as illustrative rather than restrictive. Variations can be made to those embodiments by workers skilled in the art without departing from the scope of the present invention as defined by the following claims.

We claim:

1. A method for patterning a polysilicon layer using a photoresist layer above said polysilicon layer, said method comprising the steps of:

providing a layer of amorphous silicon on the surface of said polysilicon layer;

providing a layer of antireflective material over said layer of amorphous silicon; and providing said photoresist layer on said layer of antireflective material, wherein said step of providing said layer of antireflective material comprises the step of providing a titanium nitride layer.

2. A method for patterning a polysilicon layer using a photoresist layer above said polysilicon layer, said method comprising the steps of:

providing a layer of amorphous silicon, said layer of amorphous silicon being at least 200 Å thick, on the surface of said polysilicon layer;

providing a layer of antireflective material over said layer of amorphous silicon; and providing said photoresist layer on said layer of antireflective material, wherein said layer of amorphous silicon bars diffusion of particles from said layer of antireflective material so that substantially no particles from said layer of antireflective material contact said polysilicon layer.

3. A method for increasing uniformity of photoresist exposure, said method comprising the steps of:

providing a polysilicon layer on a semiconductor substrate;

providing a temporary protective layer on said polysilicon layer;

providing an antireflective layer on said temporary protective layer, wherein said antireflective layer reflects less light than said temporary protective layer;

providing a photoresist layer on said antireflective layer;

exposing and developing said photoresist layer to uncover a portion of said antireflective layer; and removing said portion of said antireflective layer and a portion of said temporary protective layer underneath said portion of said antireflective layer, wherein the step of providing said temporary protective layer comprises the step of providing a layer of amorphous silicon, said layer being at least 200 Å thick.

4. The method of claim 3, wherein said step of providing an antireflective layer comprises the step of providing a TiN layer.

* * * * *